(12) United States Patent
Litsyn et al.

(10) Patent No.: US 8,879,317 B2
(45) Date of Patent: Nov. 4, 2014

(54) SYSTEM AND METHOD OF DECODING DATA FROM MEMORY BASED ON SENSING INFORMATION AND DECODED DATA OF NEIGHBORING STORAGE ELEMENTS

(75) Inventors: Simon Litsyn, Giva Shmuel (IL); Idan Alrod, Herzliya (IL); Eran Sharon, Rishon Lezion (IL)

(73) Assignee: Sandisk Technologies Inc., Plano, TX (US)

( * ) Notice: Subject to any disclaimer, the term of this patent is extended or adjusted under 35 U.S.C. 154(b) by 173 days.

(21) Appl. No.: 13/401,038

(22) Filed: Feb. 21, 2012

(65) Prior Publication Data

US 2012/0224421 A1 Sep. 6, 2012

Related U.S. Application Data

(60) Provisional application No. 61/447,791, filed on Mar. 1, 2011.

(51) Int. Cl.
*G11C 16/04* (2006.01)
*G11C 16/08* (2006.01)
*G11C 16/34* (2006.01)

(52) U.S. Cl.
CPC .............. *G11C 16/08* (2013.01); *G11C 16/349* (2013.01)
USPC ............. 365/185.03; 365/185.24; 365/185.02

(58) Field of Classification Search
USPC .......................... 365/185.03, 185.24, 185.02
See application file for complete search history.

(56) References Cited

U.S. PATENT DOCUMENTS

| | | | |
|---|---|---|---|
| 5,867,429 A | 2/1999 | Chen et al. | |
| 7,746,691 B2 | 6/2010 | Roohparvar et al. | |
| 7,751,237 B2 | 7/2010 | Alrod et al. | |
| 7,768,830 B2 | 8/2010 | Shibata et al. | |
| 7,864,574 B2 * | 1/2011 | Cho et al. ................. | 365/185.03 |
| 7,990,764 B2 | 8/2011 | Alrod et al. | |
| 8,264,883 B2 * | 9/2012 | Lim et al. .................. | 365/185.12 |
| 8,335,107 B2 * | 12/2012 | Lee ........................... | 365/185.11 |
| 8,508,989 B2 | 8/2013 | Alrod et al. | |
| 2008/0116502 A1 | 5/2008 | Lutze et al. | |
| 2010/0165730 A1 | 7/2010 | Sommer et al. | |

FOREIGN PATENT DOCUMENTS

| | | |
|---|---|---|
| WO | 2007132453 A2 | 11/2007 |
| WO | 2007132453 A3 | 11/2007 |
| WO | 2009040784 A1 | 4/2009 |

* cited by examiner

*Primary Examiner* — Connie Yoha
(74) *Attorney, Agent, or Firm* — Toler Law Group, PC

(57) ABSTRACT

Systems and methods to decode data stored in a data storage device are disclosed. Data bits stored in a first group of storage elements are decoded using data in a second group of storage elements together with physical characteristics of the second group of storage elements to aid in the decoding of the first group of storage elements.

30 Claims, 6 Drawing Sheets

SYSTEM AND METHOD OF DECODING DATA FROM MEMORY BASED ON SENSING INFORMATION AND DECODED DATA OF NEIGHBORING STORAGE ELEMENTS

REFERENCE TO EARLIER-FILED APPLICATIONS

This application claims priority from U.S. Provisional Patent Application No. 61/447,791, filed Mar. 1, 2011, the contents of which is incorporated by reference herein in its entirety.

FIELD OF THE DISCLOSURE

The present disclosure is generally related to decoding data from a memory.

BACKGROUND

Non-volatile memory devices, such as universal serial bus (USB) flash memory devices or removable storage cards that hold data between power cycles, have allowed for increased portability of data and software applications. As process advances enable smaller physical dimensions of memory cells, physical effects such as coupling between floating gates of transistors of neighboring cells become more pronounced.

SUMMARY

Under certain circumstances, a read operation at one memory cell may help in decoding an adjacent memory cell. Using corrective measures, such as error correction code (ECC) processing, or taking advantage of the difference between the fine reading resolution and the coarse resolution of the states of the memory during the decoding of the one memory cell operation, one can estimate an apparent shift of the charge level of the one memory cell, and use the apparent shift to help decode the adjacent memory cell.

Systems and methods to decode data stored in a data storage device are disclosed. Data bits stored in a first group of storage elements are decoded using data in a second group of storage elements together with physical characteristics of the second group of storage elements (such as measured threshold voltages of the second group of storage elements) to aid in the decoding of the first group of storage elements. For example, information about the data stored in the first group of storage elements may be obtained by reading a threshold voltage of the storage elements of the second group. A predicted threshold voltage may be obtained after reading the threshold voltage based on the discrete state the threshold voltage represents, or by decoding data following ECC processing of the information. The difference between the predicted threshold voltage and the read threshold voltage (e.g., the "shadow" of the first group on the second group) may be due to cross coupling effects (e.g., when the first group of storage elements is programmed, disturbing stored values at the second group of storage elements). As a result, the difference attained through reading and decoding the second group of storage elements represents information regarding a value that is programmed in the first group of storage elements. The difference may be used to obtain information about the first group of storage elements for use in decoding the first group of storage elements. The difference between the predicted threshold voltage and the read threshold voltage may also be a result of the difference between the reading resolution and the resolution of the states of the memory.

DETAILED DESCRIPTION

By using data that is generated as a result of sensing data of memory elements and determining an error corrected version of the data, a subsequent read of neighboring memory elements may be improved. For example, among the reasons that cause a memory device, such as a flash memory device, to exhibit errors are physical effects such as cross coupling caused due to the close proximity of floating gates of adjacent memory elements. A floating-gate-to-floating-gate coupling phenomenon occurs most pronouncedly between sets of adjacent memory elements that are programmed at different times. To illustrate, a memory element may be programmed to add a level of charge to its floating gate that corresponds to one set of data. Subsequently, one or more adjacent memory elements may be programmed to add a level of charge to their floating gates that correspond to another set of data. After the one or more of the adjacent memory elements are programmed, the charge level read from the memory element appears to be different than programmed because of the effect of the charge on the adjacent memory elements. The floating-gate-to-floating-gate coupling from adjacent memory elements can shift the apparent charge level read from the memory element a sufficient amount to lead to an erroneous reading of the stored data of the first memory element.

Alternatively, data read from a memory in response to a data read operation may be read with a higher resolution (i.e., soft bits) than a state resolution. The difference between the read threshold voltage and the expected threshold voltage may assist in subsequent data read operations by using the apparent shift of the electrical charge even when the reading is not erroneous. To illustrate, an electrical charge may have shifted within a state window but the reading may still be correct. The shift in charge may be used when decoding a neighbor memory element.

Memory elements of a flash memory may include a word line and adjacent memory elements may include an adjacent word line. Cross coupling effects are most common between adjacent word lines. Information obtained from reading and decoding data read from a word line may be used in reading data from an adjacent word line. For example, information about the data stored in a first group of storage elements may be obtained by reading a threshold voltage of the storage elements of a second group of storage elements. A predicted threshold voltage may be obtained by decoding data, such as following ECC processing of the information. The difference between the predicted threshold voltage and the read threshold voltage may be due to cross coupling effects. The difference determined by reading and decoding the second group of storage elements represents information regarding a value that is programmed in the first group of storage elements. Such information may be used in decoding the first group of storage elements.

Figure 1:
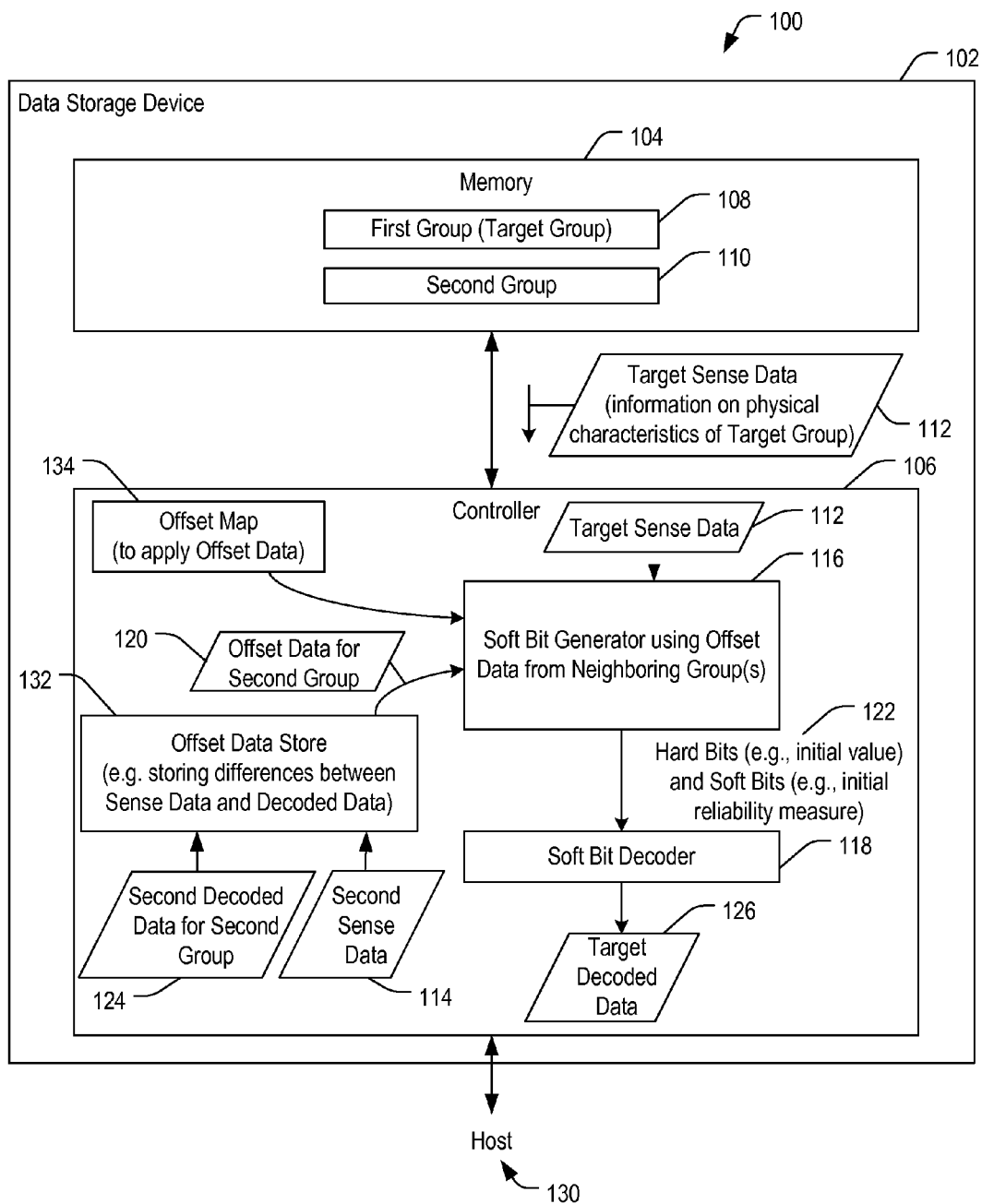
FIG. 1 is a block diagram of a particular embodiment of a system to decode data from memory based on sensing information and decoded data of neighboring storage elements.

Referring to FIG. 1, a particular embodiment of a system to decode data from memory based on sensing information and decoded data of neighboring storage elements is illustrated and generally designated 100. The system 100 includes a data storage device 102 that may be in communication with a host device 130. The data storage device 102 includes a memory 104 coupled to a controller 106. Data read from the memory 104 in response to a data read operation is tested by the controller 106 for a possible disturb error, such as an error due to cross coupling effects. If an error is detected, the error is corrected before being provided to a requesting device. Information about such errors can be used by the controller 106 to assist in subsequent data read operations. Alternatively, the data read from the memory 104 in response to a data read operation may be read with a higher resolution (i.e., soft bits) than the state resolution. After decoding the data the difference between the read threshold voltage and the expected threshold voltage corresponding to the decoded state may assist in subsequent data read operations.

The memory 104 includes a first or target group of storage elements (e.g., memory cells) 108 and a second group of storage elements 110. The memory 104 may be configured as a memory array of a flash device, such as a NAND flash device, a NOR flash device, or any other type of flash device.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) and eSD, as illustrative examples.

The controller 106 includes a soft bit generator 116, a soft bit decoder 118, an offset map 134, and an offset data store 132. The controller 106 is configured to receive memory access requests from the host 130 and to process data read from the memory 104. In a particular embodiment, the controller 106 is configured to receive target sense data 112 from the memory 104. For example, the target sense data 112 may include information about the physical characteristics of the target group of storage elements 108. Each storage element of the target group of storage elements 108 may store one or more data bits by having a physical characteristic, such as a threshold voltage, of the storage element set to a corresponding range of values. For example, a threshold voltage with a defined range of values may indicate a particular data value or bit pattern.

The offset data store 132 is configured to store sense data and decoded data for groups of storage elements that have been read and provide offset data for the second group 120 to the soft bit generator 116 when the target group of storage elements 108 is read. The offset data 120 may be associated with the "shadow" of other storage elements. A "shadow" of the first group on the second group is associated with a difference between a predicted threshold voltage and a read threshold voltage. For example, information about the data stored in the first group of storage elements 108 may be obtained by reading a threshold voltage of the storage elements of the second group of storage elements 110. A predicted threshold voltage may be obtained by decoding data following ECC processing of the information. The difference between the predicted threshold voltage and the read threshold voltage correlates with the shadow of the first group of storage elements 108 on the second group of storage elements 110. Alternatively, the data read from the memory 104 in response to a data read operation may be read with a higher resolution than the state resolution. After decoding the data the difference between the read threshold voltage and the expected threshold voltage corresponding to the decoded state may assist in subsequent data read operations.

The offset data store 132 is configured to receive the second sense data 114 and the second decoded data for the second group 124, to store differences between the second sense data 114 and the second decoded data for the second group 124, and to provide offset data for the second group 120 to the soft bit generator 116 to provide additional information to the soft bit decoder 118 when the soft bit decoder 118 is decoding the target group of storage elements 108. To illustrate, the data bits stored in the first group of storage elements 108 may be decoded by determining an offset for each storage element of the second group. The offset may correspond to a difference between a sensed value for the storage element and a decoded value for the storage element, and it is obtained either by error correction or by sensing with a finer resolution than the resolution of the possible decoded values. The difference that may have been caused by programming the target group of storage elements 108 is further described with respect to FIG. 3.

The soft bit generator 116 is configured to receive the target sense data 112, to receive data from the offset map 134, and to receive the offset data 120 from the offset data store 132. The offset map 134 may contain information associated with each storage element in a neighboring group of storage elements that is affected by a particular storage element and a weighting factor indicating the strength of the effect between the particular storage element and the affected storage elements. For example, the offset map 134 may be used to apply offset data related to affected neighbors of the second group of storage elements 110.

The soft bit generator 116 is further configured to adjust a soft bit value for each storage element of the first group 108 according to the offset data 120 for the second group 110 and to provide adjusted soft bit values, such as soft bits in output data 122, to the soft bit decoder 118.

The soft bits in the output data 122 include reliability information about the bit value stored in or read from the storage element. For example, a storage element may be programmed to have one of multiple predefined states. Each of the predefined states may be mapped to a particular bit value. The bit value(s) that corresponds to the determined storage element state is referred to as a "hard bit". Additional information that can be used to indicate a reliability of the reading of the storage element is referred to as "soft bit(s)". A soft bit can be used by the soft bit decoder 118 in conjunction with one or more hard bits to enhance a reading efficiency by indicating a relative reliability of the hard bits read from the memory 104.

The soft bit generator 116 provides output data 122 that includes hard bits that correspond to the physical characteristics sensed from the storage elements in the target group 108 and soft bits that provide an initial reliability measure of the read data of the storage elements of the target group 108 based on the offset data of the second group 110. For example, the reliability measures may comprise Log Likelihood Ratios (LLRs) of the encoded bits. Typically, a high positive LLR value indicates that an encoded bit is likely to be a logic zero value and a high negative LLR value indicates that the encoded bit is likely to be a logic one value. An LLR having a small absolute value may indicate a less-reliable encoded bit. In addition, information about the physical characteristics of the storage elements of the second group 110 can affect the decoding of data bits stored in the storage elements of the target group 108 by affecting the initial reliability measures of the data bits of the target group 108.

For example, a reliability measure can be retrieved from a look up table based on the read threshold value of a particular storage element and offset data of its neighboring storage elements. Data corresponding to the read threshold value (e.g., hard bit(s)) and the reliability measure (e.g., soft bit(s)) may be provided to the soft bit decoder 118. The soft bit decoder 118 is an error correction code (ECC) decoder that is configured to receive the output data 122 of the soft bit generator 116 and to generate decoded data bits (e.g. the target decoded data 126) of the storage elements of the target group 108.

During operation, the controller 106 may decode data stored in the target group 108 of storage elements using decoded data of the second group 110 of storage elements together with the physical characteristics of the second group 110 of storage elements to aid in the decoding of the target group 108 of storage elements. For example, in response to a memory read operation of the target group 108 of storage elements and the second group 110 of storage elements, the controller 106 may initiate a sensing operation to sense the storage elements in the second group 110 and generate information about the physical characteristics of the storage elements of the second group 110 to aid in the decoding of the target group 108 of storage elements.

The controller 106 may decode the data stored in the second group 110 and may determine an offset for each storage element of the second group 110. The offset may correspond to a difference between a sensed value for the storage element and a decoded value for the storage element, as described with reference to FIG. 3. For example, the second group 110 of storage elements may be sensed by reading the second group 110 of storage elements, and sense data including a sensed value for each storage element may be generated. The sensed value may be decoded and compared to an expected decoded value based on decoded data resulting from ECC processing of the sense data. A difference between the expected decoded value and the sensed value may be due to cross coupling effects when the target group 108 is programmed. For example, the cross coupling effects may disturb a stored value at the second group 110.

In response to a request to read the storage elements of the target group 108, the controller may retrieve the target sense data 112, the data from the offset map 134, and the offset data 120 and generate a soft bit value for each storage element of the target group 108 according to the offset values of one or more of the storage elements of the second group 110. For example, the offset map 134 may identify one or more neighboring storage elements of a particular storage element of the second group 110 that may have contributed to the offset of each storage element in the second group 110. In addition, the offset map 134 may be used to adjust a soft bit value for storage elements of the target group 108.

The controller 106 may provide the output data 122 including hard bits based on the target group 108 and soft bits based on the offset data 120 of the second group 110 to the soft bit decoder 118. The soft bit decoder 118 may generate decoded data bits based on the received data. The controller 106 may update/populate the offset map 134 with results of reading the target group 108 (e.g., sense data and decoded data, or offset data) for a subsequent read operation of a neighboring group of storage elements or of a neighboring word line. Thus, information derived from reading data of the second group 110 may be used in order to assist in decoding the target group 108.

A voltage difference $\Delta V$ between a predicted threshold voltage and a read threshold voltage may be used to provide additional information for determining data values stored at the first group of storage elements 108. For example, the second group of storage elements 110 may be read at a higher resolution than the first group of storage elements 108. The lower resolution sense data of the first group 108 may be supplemented at the soft bit decoder 118 with the voltage difference $\Delta V$, such as by generation of soft bits by the soft bit generator 116. As a result, by using a lower resolution, a data read time of the first group of storage elements 108 may be improved due to a lower number of threshold voltage comparison operations to generate the sensing data for reading the first group of storage elements 108. A potential loss of accuracy due to using a lower sense resolution may be at least partially offset by the additional information provided by the voltage difference $\Delta V$ from a prior read of the second group 110.

Figure 2:
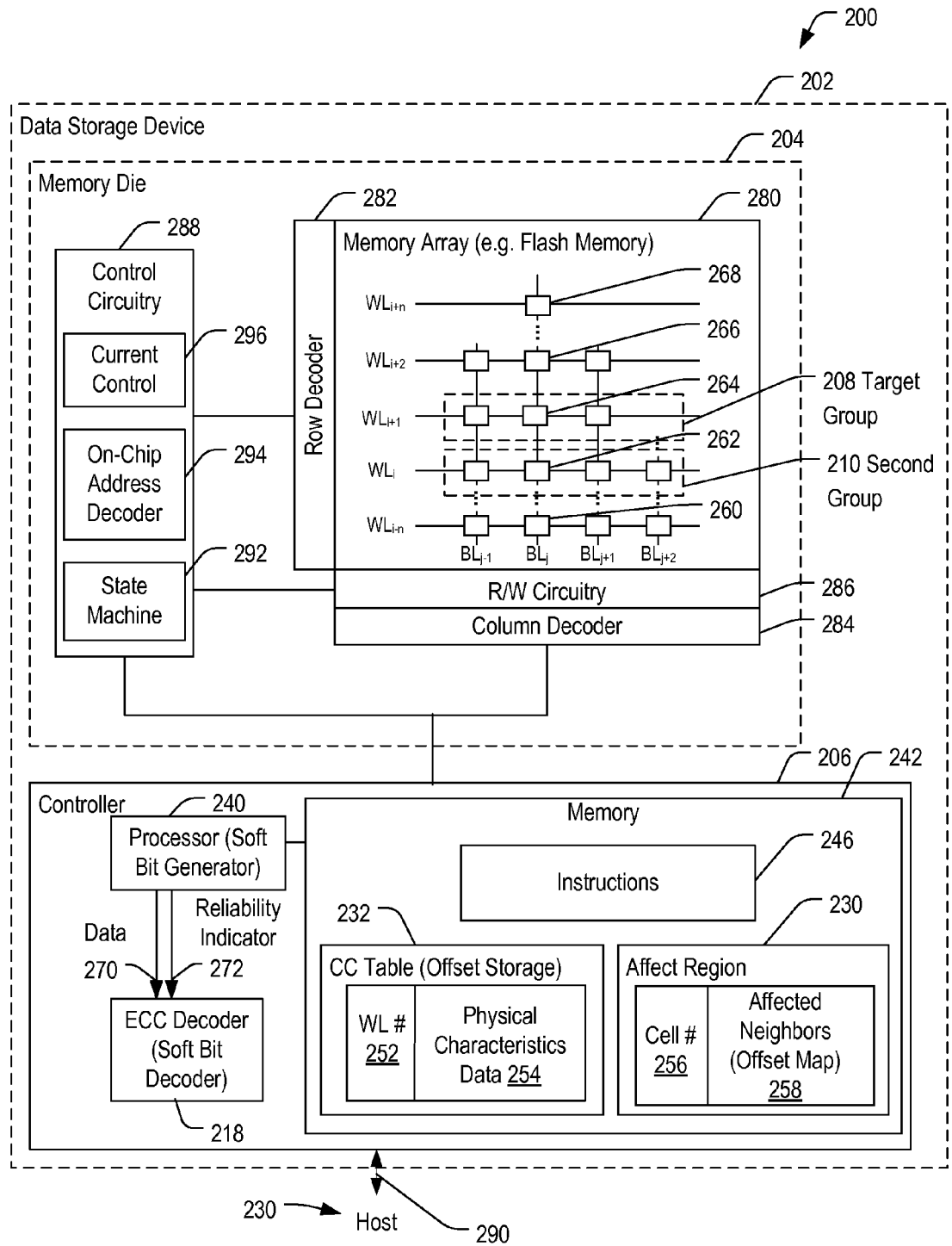
FIG. 2 is a block diagram of a second particular embodiment of a system to decode data from memory based on sensing information and decoded data of neighboring storage elements.

FIG. 2 is a block diagram of a second particular embodiment of a system to decode data from memory based on sensing information and decoded data of neighboring storage elements. The system 200 includes a data storage device 202 in communication with a host 230 via a channel 290. The data storage device 202 includes a controller 206 that is coupled to one or more dies, such as a representative memory die 204. In an illustrative embodiment, the data storage device 202 may be the data storage device 102 of FIG. 1.

The memory die 204 includes a memory array 280, control circuitry 288, and read/write circuitry 286. The memory array 280 may be a two-dimensional array or a three-dimensional array of storage elements (e.g., flash memory cells). The memory array 280 is addressable by word lines via a row decoder 282 and by bit lines via a column decoder 284. The read/write circuitry 286 may be operative to enable a page of storage elements to be read or programmed in parallel.

The control circuitry 288 cooperates with the read/write circuitry 286 to perform memory operations at the memory array 280. The control circuitry 288 may include a state machine 292, an on-chip address decoder 294, and a current control module 296. The state machine 292 may provide chip-level control of memory operations. The on-chip address decoder 294 may provide an address interface between an address used by the host 230 or a memory controller (not shown) to the hardware address used by the row decoder 282 and the column decoder 284. The current control module 296 may control the current and/or voltages supplied to the word lines and bit lines during memory operations.

The memory array 280 includes representative word lines WL(i−n), WL(i), WL(i+1), WL(i+2) and WL(i+n). The memory array 280 also includes representative bit lines BL(j−1), BL(j), BL(j+1), and BL(j+2). Representative storage elements are depicted at intersections of word lines and bit lines, such as representative storage elements $M_{i-n,j}$ 260, $M_{i,j}$ 262, $M_{i+1,j}$ 264, $M_{i+2,j}$ 266, and $M_{i+n,j}$ 268 coupled to the bit line BL(j). The memory array 280 includes representative groups of storage elements, such as a target group 208 of storage elements and a second group 210 of storage elements. In the illustrated embodiment, the target group 208 includes a target word line, such as the word line WL(i+1), and the second group 210 includes a second word line, such as the word line WL(i). The target group 208 and the second group 210 may be physically adjacent to each other.

The controller 206 is included in the same data storage device 202 (e.g., a removable storage card) as the one or more memory die 204. Commands and data may be transferred between the host 230 and the controller 206 via one or more lines of the channel 290. The controller 206 includes a processor 240 coupled to a memory 242 and also includes an error correction code (ECC) decoder 218.

In the illustrated embodiment, the memory 242 includes program instructions 246 that are executable by the processor 240 to receive physical characteristics data 254 that is sensed from the storage elements of a group of storage elements, such as the second group 210. The physical characteristics data 254 of the second group 210 may be associated with the storage elements of a particular word line number (or index), such as the word line number 252. The word line number 252 may correspond to one of the word lines (e.g., 260-268) of the memory array 280. The physical characteristics data 254 associated with the particular word line number 252 may be stored at a table in the memory 242, such as at cross coupling (CC) table 232. The program instructions 246 may also be executable by the processor 240 to receive affected neighbors data 258 that is associated with a particular storage element, such as the cell number (or index) 256. The affected neighbors data 258 associated with the particular cell number 256 may be stored at a dedicated data structure (e.g., a table) 230 storing affect region data.

The program instructions 246 may be executable by the processor 240 to provide data 270 and an initial reliability indicator 272. The data 270 may include hard bits that correspond to the physical characteristics sensed from the storage elements in the target group 208. The reliability indicator 272 may include soft bits that provide a reliability indicator of the read data of the storage elements of the target group 208 based on the offset data of the second group 210. A soft bit can be used by the ECC decoder 218 to enhance a reading efficiency by indicating a relative reliability of the hard bits read from the memory 204.

For example, information about the physical characteristics of the storage elements of the second group 210 can affect the decoding of data bits stored in the storage elements of the target group 208 by affecting initial reliability measures assigned to the data bits stored in the storage elements of the target group 208. The ECC decoder 218 is configured to receive the data 270 and the reliability indicator 272 and to perform a correction operation at least partially based on the reliability indicator 272. The reliability indicator 272 can indicate a log-likelihood ratio (LLR) for each particular bit of the data 270.

The controller 206 is configured to initiate a sensing operation to sense the storage elements in the second group 210 and to generate information about the physical characteristics of the storage elements of the second group 210. The controller 206 is further configured to initiate a decoding operation to decode data bits stored in the storage elements of the second group 210, to initiate a sense operation to sense the storage elements in the target group 208, and to generate information about the physical characteristics of the storage elements of the target group 208. The controller 206 is further configured to decode data bits stored in the storage elements of the target group 208 according to the information about the physical characteristics of the storage elements of the second group 210, according to the decoded data bits of the second group 210, and according to the information about the physical characteristics of the storage elements of the target group 208.

During operation, the controller 206 may decode data stored in the target group 208 of storage elements using decoded data of the second group 210 of storage elements together with the physical characteristics of the second group 210 of storage elements from the cross coupling table 232 to aid in the decoding of the target group 208 of storage elements. For example, the controller 206 may receive a data read request from the host 230 and may initiate a sensing operation to sense the storage elements in the second group 210 and generate information about the physical characteristics 254 of the storage elements of the second group 210. To illustrate, when the data read request includes a request for data stored at $M_{i,j}$ 262, the controller 206 may also initiate reads of neighbor storage elements that share the same word line WL(i) as the addressed storage element $M_{i,j}$ 262, such as neighbor storage elements $M_{ij-i}$ and $M_{ij+1}$.

The controller 206 may be configured to determine an offset for each storage element of the second group 210. The offset may correspond to a difference between a sensed value for the storage element and a decoded value for the storage element as described with reference to FIG. 3. For example, the word line $WL_i$ comprising the second group 210 may be sensed and sense data including a sensed value for each storage element may be generated. The sensed value of a particular storage element, such as $M_{ij-1}$, may be decoded and compared to an expected decoded value based on decoded data resulting from ECC processing at the ECC decoder 218 of the sense data. A difference between the expected decoded value of $M_{ij-1}$ and the sensed value of $M_{ij-1}$ corresponds to cross coupling effects when the target group 208 is programmed, disturbing a stored value at the second group 210.

The controller 206 may be configured to adjust a soft bit value for each storage element of the target group 208 according to the offset values of one or more of the storage elements of the second group 210. For example, the affected neighbors data 258 of a particular storage element 256 of the second group 210 may be used to identify one or more neighboring storage elements that may have contributed to the offset of each storage element of the second group 210 and to adjust corresponding soft bit value for storage elements of the target group 208. For example, the affected neighbor data 258 of storage element $M_{ij}$ 262 may be used to identify one or more neighboring storage elements, such as $M_{ij-i}$ and $M_{ij+1}$ that have contributed to the offset of each storage element of the second group 210.

The controller 206 may provide the adjusted bit values (e.g., the data 270 and the reliability indicator 272) to the ECC decoder 218. For example, the data 270 may correspond to "hard" bits that indicate, for each storage element that is read, a specific range of threshold voltages that encompasses the measured threshold voltage of the storage element. The reliability indicator 272 may include, for each of the storage elements that is read, a value that indicates a confidence that the hard bits for that storage element are correct, based on offset data of neighboring storage elements. Although the soft bit values are illustrated as having a separate data 270 and reliability indicator 272, in other implementations the soft bit values may include a single indicator for each read storage element, such as a log-likelihood ratio (LLR). The ECC decoder 218 may be configured to use the data 270 for initial estimates of bit values of the storage elements and use the reliability indicator 272 to guide error correction processing to generate decoded data bits based on the received soft bits.

The controller 206 may update/populate the cross coupling table 232 with the offset values of the target group 208 read for a later read of a neighboring word line.

Thus, information derived from reading data of the second group 210 may be used in order to assist in decoding the target group 208.

Figure 3:
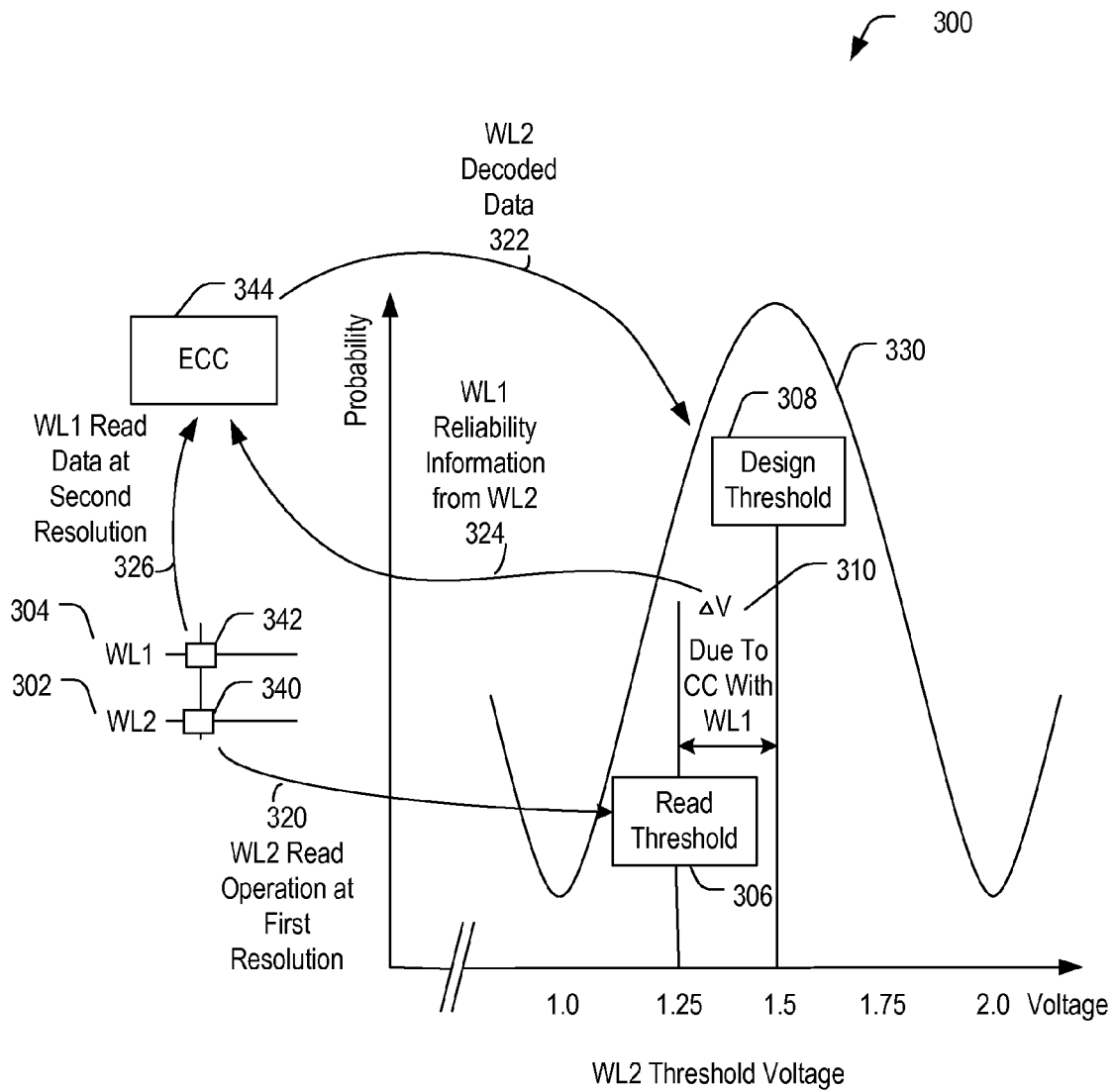
FIG. 3 is a diagrammatic illustration of decoding data from memory based on sensing information and decoded data of neighboring storage elements.

FIG. 3 is a diagrammatic illustration 300 of decoding data from memory based on sensing information and decoded data of neighboring storage elements. In an illustrative embodiment, the memory may be the memory 104 of FIG. 1 or the memory array 280 of FIG. 2.

The memory includes a first word line, such as word line 1 (WL1) 304, with multiple storage elements including a representative storage element 342 that may be sensed at various resolutions. For example, each storage element of WL1 304 may have a threshold voltage that can be compared to a first set of reference voltages to determine a data value stored at the storage element. The memory also includes a second word line, such as word line 2 (WL2) 302, with multiple storage elements including a representative storage element 340 that may be sensed at various resolutions.

A curve 330 illustrates a probability that a threshold voltage of the storage element 340 has a value between 1.0 volts (V) and 2.0 volts (V). For example, a threshold value of less than 0V may correspond to a "11" bit value, a threshold value of 0V to 1.0V may correspond to a "10" bit value, a threshold value of 1.0V to 2.0V may correspond to a "00" bit value, and a threshold value of greater than 2.0V may correspond to a "01" bit value. Each storage element may be initially programmed to have a threshold voltage at the center of the storage element's designated voltage interval. For example, the storage element 340 may store a "00" bit value by being programmed to have a threshold voltage at a design threshold 308 of 1.5V in the center of the interval from 1.0V to 2.0V. However, due to effects such as cross coupling between adjacent word lines, the threshold voltage may shift away from the design threshold 308.

The storage element 340 may be sensed at a first resolution such that reading at the first resolution enables a determination of a read threshold 306 of 1.25 volts. The first sensing resolution may be higher than the resolution needed to determine whether the storage element 340 is in a voltage range encompassed by the curve 330. For example, although determination of a bit value of each storage element in the second word line 302 may only require sensing at intervals of 1.0 V (e.g., sensing at 0V, 1V, 2V, and 3V), the storage elements may instead be sensed at a higher resolution by sensing at intervals of 0.25V.

The sensed value may be mapped to one or more data bits to identify an expected threshold value. For example, when the storage element 340 that has the read threshold 306 is sensed, an expected (e.g., an originally programmed) threshold of 1.5 volts may be identified. For example, sensing a threshold voltage anywhere in the interval from 1V to 2V may indicate that the storage element 340 stores a "00" bit value, which corresponds to the 1.5V design threshold 308. A difference between the read threshold 306, as compared to the design threshold 308, results in offset data, illustrated as a voltage difference ΔV 310. Alternatively, the offset data may be obtained by error correction, such as by ECC processing at the ECC decoder 344. For example, if a sensed voltage is not within the same voltage window as a design voltage, then a difference between the read threshold 306, as compared to the design threshold 308 based on the decoded data 322 resulting from ECC processing of the sense data, results in offset data.

The voltage difference ΔV 310 may be due at least in part to cross coupling effects from a neighboring word line (WL1) 304. When the neighboring word line 304 is programmed, the threshold voltage of the storage element 340 of the second word line 302 may be shifted by an amount that is proportional to a voltage programmed to the storage element 342 of the neighboring word line 304. To illustrate, the first storage element 342 and the second storage element 340 may be coupled to a common bit line and located at adjacent word lines. The voltage difference ΔV 310 represents information regarding a value that is programmed in the first storage element 342 of the first word line 304 (i.e., the "shadow" of the first word line 304), although the voltage difference ΔV 310 was attained through reading and decoding the second storage element 340 of the second word line 302.

When the first word line 304 is to be read, the voltage difference ΔV 310 may be used to provide additional information for determining data values stored at the first word line 304. For example, the first word line 304 may be read at a lower resolution than the second word line 302 was read at. The lower resolution sense data may be supplemented with the voltage difference ΔV 310, such as by a generation of soft bits by the soft bit generator 116 of FIG. 1. By using a lower resolution, a data read time to read data from the first word line 304 may be reduced due to a lower number of threshold voltage comparison operations used to read the first word line. A potential loss of accuracy due to using a lower sense resolution may be at least partially offset by the additional information provided by the voltage difference ΔV 310.

In some embodiments, the first word line 304 may be decoded without actually performing a sensing operation of the first word line 304. For example, the reliability information from the second word line 302, illustrated as reliability information 324, may be sufficient to enable the decoder 344 to decode data stored at the first word line 304 solely based on the effects of programming of the first word line 304 determined when reading the second word line 302 (i.e., solely based on the "shadow" of the first word line 304 detected at the second word line 302).

By using information that is generated as a result of sensing data and determining an error corrected version of the data, improved sensitivity of reading a neighboring storage element may be achieved. As a result, subsequent reading of the neighboring storage element may be performed with a lower resolution and hence increased speed of operation at a same resolution and with more accuracy, or may be determined without directly sensing the neighboring storage element at all.

Decoding of flash memory systems is conventionally performed in word lines. As such, the target group of storage elements may be a word line and the second group of storage elements may be an adjacent word line. Cross coupling effects are most common between adjacent word lines.

If a particular state of the second group of storage elements is associated with a certain voltage window, such as the voltage window illustrated in FIG. 3 in which the voltage window extends from 1 to 2 volts and the designed threshold voltage of a storage element in the state is 1.5 volts, then a reading of 1.25 volts would not cause an error in decoding because the designated threshold voltage is within the voltage window of the same state (e.g., between 1 and 2 volts). After decoding it may be determined that there was a "mismatch" of 0.25 volts between the designed voltage and the read voltage. This difference may be associated with or correspond to the cross coupling due to the target group of storage elements. If the cross coupling coefficient is known and the specific storage element which is dominant in the cross coupling is known, then preliminary information regarding the decoding of the specific storage element may be determined.

In addition, with the cross coupling effect, a word line that is programmed later in time affects adjacent word lines that were programmed earlier in time. As such, the target word line is typically programmed later in time than the second word line.

One embodiment of the present disclosure uses the physical characteristics and decoding of the second word line to affect initial reliability measures, such as initial log-likelihood ratio (LLR) values, associated with the target word line. In order to use a difference between the decoded data and the read threshold voltages, the second word line may be read with a resolution that is higher than the resolution corresponding to a number of bits stored in each storage element of the second word line (e.g., the second word line may be read with soft bits).

The target word line may be read with a higher resolution than a resolution corresponding to a number of bits stored in each storage element of the target word line. Alternatively, the target word line may be read with a resolution corresponding to a number of bits stored in each storage element of the target word line or with a lower resolution than a resolution corresponding to a number of bits stored in each storage element of the target word line.

The present disclosure is applicable to single-level cell (SLC) storage elements (e.g., storage elements that store one bit per storage element), or to multi-level cell (MLC) storage elements (e.g., storage elements that store multiple bits per storage element).

Embodiments of the present disclosure may work best when the cross coupling effects are small. However, implementing the present disclosure in a high cross coupling environment may be achieved using reference data so that decoding without an error is not an issue, and the difference between the actual threshold voltages and the expected threshold voltages (for the reference data) may help in decoding the data of the target group of storage elements (e.g., the target word line).

Another embodiment of the present disclosure may utilize joint decoding of the first word line and the second word line using the threshold voltages of both word lines and the decoded data of both word lines. An example of an implementation of joint decoding may take the difference between the reading of a storage element and the reading of the closest state of the storage element and use the difference to set the LLR value for a storage element in an adjacent line. The differences may be related to an error in reading of the storage element, particularly in light to moderate cross coupling environments. An example of joint decoding is described with respect to FIG. 6.

In an alternative embodiment, the target group of storage elements may be decoded without reading the threshold voltages of the target group of storage elements. An embodiment according to this implementation senses the storage elements in a second group of storage elements (where the data bits stored in the storage elements of the target group affect the physical characteristic of the second group of memory storage elements), to generate information about the physical characteristic of the storage elements of the second group. Data bits stored in the storage elements of the second group are decoded, and data bits stored in the storage elements of the target group are decoded. The decoding is conducted according to the information about the physical characteristic of the storage elements of the second group and according to the decoded data bits of the second group, where the storage elements of the target group are not part of the decoding.

To illustrate, assume there is an interest in retrieving data in word line(n) by reading word line(m) without reading word line(n). If word line(n) is programmed after word line(m) then programming of word line(n) leaves a "shadow" on word line(m). That shadow is part of the cross coupling observed when word line(m) is read. After reading word line(m) and successfully decoding word line(m), the decoded data of word line(m) can be subtracted from read threshold values of word line(m) to obtain the noise on word line(m). If a large portion of the noise includes the "shadow" of word line(n) in word line(m) which was programmed after word line(m), then the noise can be used to reconstruct the data of word line(n) without reading word line(n). Alternatively, the noise can be used to improve the decoding of word line(n) when word line(n) is read.

Figure 4:
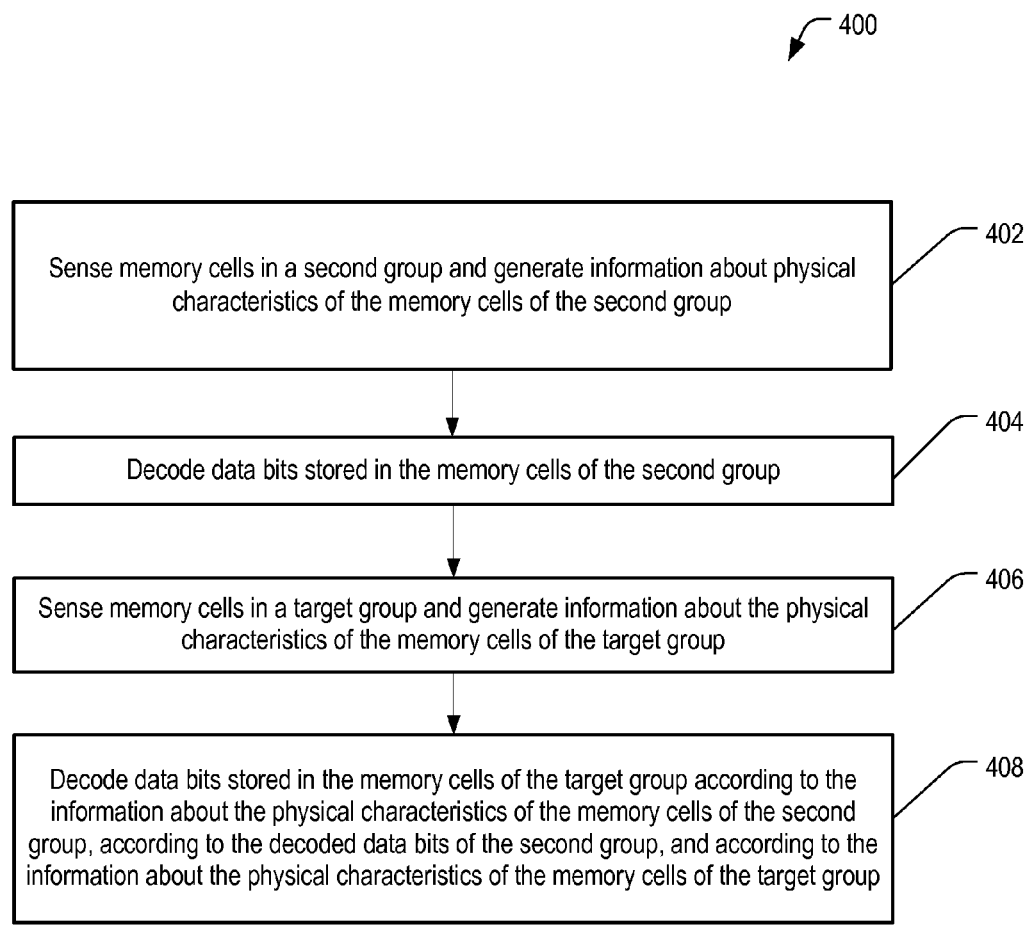
FIG. 4 is a flow diagram illustrating a particular embodiment of a method of decoding data from memory based on sensing information and decoded data of neighboring storage elements.

FIG. 4 is a flow diagram of a particular embodiment of a method of decoding data from memory based on sensing information and decoded data of neighboring storage elements and is generally designated 400. In an illustrative embodiment, the method may be implemented at the data storage device 102 of FIG. 1 or the data storage device 202 of FIG. 2.

Storage elements, such as memory cells, in a second group of storage elements at the memory are sensed, and information about physical characteristics of the storage elements of the second group is generated, at 402. For example, the second group may be the second group 110 of FIG. 1 or the second group 210 of FIG. 2. The second group may comprise a word line, such as the word line $WL_i$ of FIG. 2 or the word line 302 of FIG. 3. In an illustrative embodiment, the physical characteristic may be a threshold voltage.

Data bits stored in the storage elements of the second group are decoded, at 404. For example, the soft bit decoder 118 of FIG. 1, the ECC decoder of FIG. 2, or the ECC decoder 344 of FIG. 3 may decode the storage elements of the second group by receiving soft bit information corresponding to the storage elements of the second group and performing a correction operation based on the received soft bit information.

Continuing to 406, storage elements in a target group of storage elements at the memory are sensed, and information about the physical characteristics of the storage elements of the target group are generated, at 406. For example, the target group may be the first group 108 of FIG. 1 or the target group 208 of FIG. 2. The target group may comprise a word line, such as the word line $WL_{i+i}$ of FIG. 2 or the word line 304 of FIG. 3.

Advancing to 408, the data bits stored in the storage elements of the target group are decoded according to information about the physical characteristics of the storage elements of the second group, according to the decoded data bits of the second group, and according to the information about the physical characteristics of the storage elements of the target group. For example, the offset data store 132 of FIG. 1 may receive the second sense data 114 and the second decoded data for the second group 124, store differences between the second sense data 114 and the second decoded data for the second group 124, and provide offset data for the second group 120 to the soft bit generator 116.

The soft bit generator 116 may receive the target sense data 112, may receive data from the offset map 134, and may receive the offset data from the offset data store 132. The soft bit generator 116 may adjust a soft bit value for each storage element of the first group 108 according to the offset data for the second group 120 and may provide adjusted soft bit values, such as soft bits 122, to the soft bit decoder 118. The soft bit decoder 118 may generate decoded data bits of the storage elements, such as target decoded data 126, of the target group 108.

Improved sensitivity of reading a neighboring storage element may be achieved by using information that is generated as a result of sensing data and determining an error corrected version of the data. As a result, subsequent reading of the neighboring storage element may be performed with a lower resolution and hence with increased speed, or at a same resolution with greater accuracy.

Figure 5:
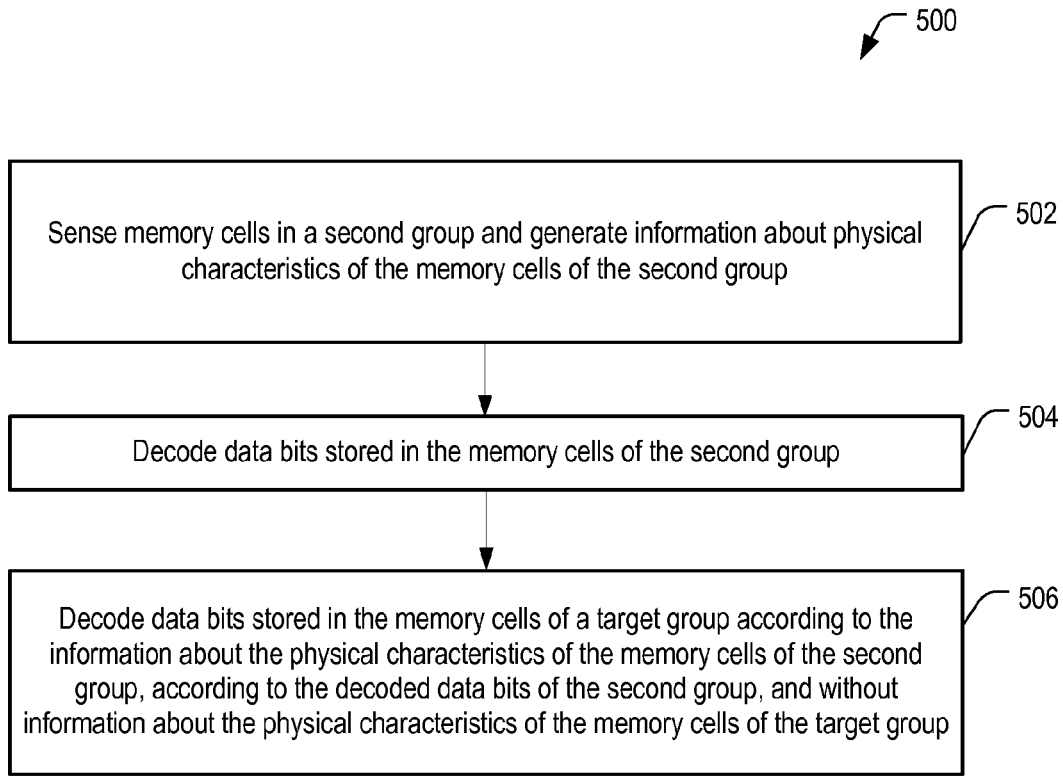
FIG. 5 is a flow diagram illustrating a second particular embodiment of a method of decoding data from memory based on sensing information and decoded data of neighboring storage elements.

FIG. 5 is a flow diagram of a particular embodiment of a method of decoding data from memory based on sensing information and decoded data of neighboring storage elements and is generally designated 500. In an illustrative embodiment, the method may be implemented at the data storage device 102 of FIG. 1 or the data storage device 202 of FIG. 2.

Storage elements, such as memory cells, in a second group of storage elements at the memory are sensed, and information about physical characteristics of the storage elements of the second group are generated, at 502. For example, the second group may be the second group 110 of FIG. 1 or the second group 210 of FIG. 2. The second group may comprise a word line, such as the word line WL of FIG. 2 or the word line 302 of FIG. 3. In an illustrative embodiment, the physical characteristic may be a threshold voltage.

Data bits stored in the storage elements of the second group are decoded, at 504. Continuing to 506, the data bits stored in the storage elements of the target group are decoded according to information about the physical characteristics of the storage elements of the second group, according to the decoded data bits of the second group, and without information about the physical characteristics of the storage elements of the target group. For example, the reliability information from the second word line 302, illustrated as reliability information 324, may be sufficient to enable the decoder 344 to decode data stored at the first word line 304 solely based on the affects of programming of the first word line 304 determined when reading the second word line 302. In this embodiment, a strong ECC encoding scheme may be beneficial. In addition, or alternatively, a high resolution read of the second word line may be beneficial.

Figure 6:
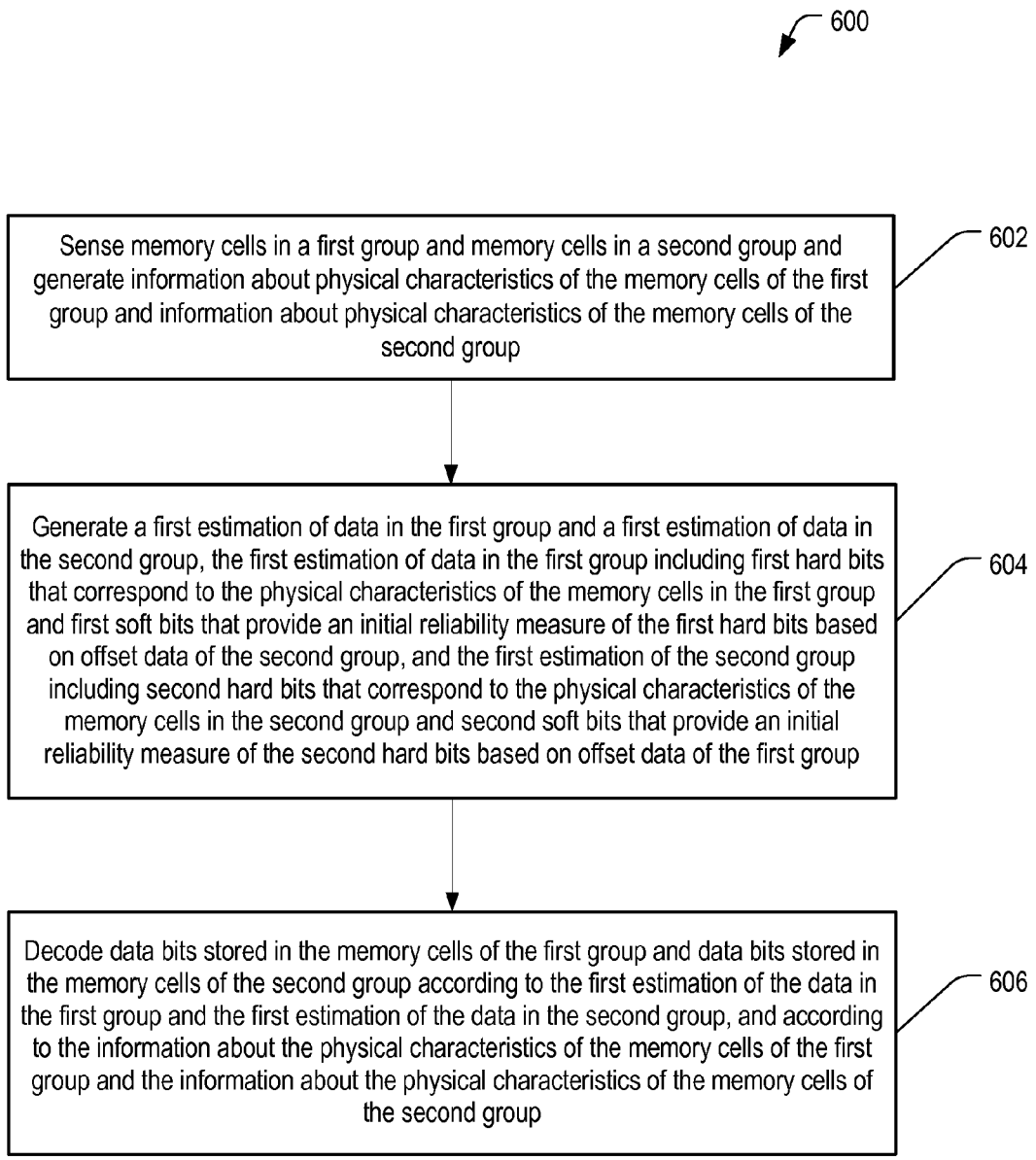
FIG. 6 is a flow diagram illustrating a third particular embodiment of a method of decoding data from memory based on sensing information and decoding data of neighboring storage elements.

FIG. 6 is a flow diagram of a particular embodiment of a method of decoding data from memory based on sensing information and decoding data of neighboring storage elements and is generally designated 600. In an illustrative embodiment, the method may be implemented at the data storage device 102 of FIG. 1 or the data storage device 202 of FIG. 2.

Storage elements, such as memory cells, in a first group of storage elements at the memory and at a second group of storage elements at the memory are sensed, and information about physical characteristics of the storage elements of the first group and information about physical characteristics of the storage elements of the second group is generated, at 402. For example, the first group may be the first group 108 of FIG. 1 or the first group 208 of FIG. 2 and the second group may be the second group 110 of FIG. 1 or the second group 210 of FIG. 2. The first group may comprise a first word line, such as the word line $WL_{i+l}$ of FIG. 2 or the word line 304 of FIG. 3. The second group may comprise a second word line, such as the word line $WL_i$ of FIG. 2 or the word line 302 of FIG. 3. In an illustrative embodiment, the physical characteristic may be a threshold voltage.

A first estimation of data in the first group and a first estimation of data in the second group are generated, at 604. The first estimation of data in the first group may include first hard bits that correspond to the physical characteristics of the storage elements in the first group and first soft bits that provide an initial reliability measure of the first hard bits based on offset data of the second group. The first estimation of the second group may include second hard bits that correspond to the physical characteristics of the storage elements in the second group and second soft bits that provide an initial reliability measure of the second hard bits based on offset data of the first group.

Advancing to 606, the data bits stored in the storage elements of the first group and the data bits stored in the storage elements of the second group are decoded according to the first estimation of the data in the first group and the first estimation of the data in the second group, and according to the information about the physical characteristics of the storage elements of the first group and the information about the physical characteristics of the memory cells of the second group.

To illustrate, an offset value for each storage element of the first group may be determined. The offset may correspond to a difference between a sensed value for the storage element of the first group and an estimated data value for the storage element of the first group. Similarly, an offset value for each storage element of the second group may be determined. The offset may correspond to a difference between a sensed value for the storage element of the second group and an estimated data value for the storage element of the second group. A soft bit value for each storage element of the first group may be adjusted according to the offset values of one or more of the storage elements of the second group. Similarly, a soft bit value for each storage element of the second group may be adjusted according to the offset values of one or more of the storage elements of the first group. The adjusted soft bit values may be provided to a decoder, where the decoder decodes the data bits.

Although various components depicted herein are illustrated as block components and described in general terms, such components may include one or more microprocessors, state machines, or other circuits configured to enable a data storage device, such as the data storage device 102 of FIG. 1 or the data storage device 202 of FIG. 2, to perform the particular functions attributed to such components, or any combination thereof. For example, the soft bit generator 116 of FIG. 1 may represent physical components, such as controllers, state machines, logic circuits, or other structures to enable the data storage device 102 to receive and respond to data requests from a host device or from other external devices to decode data stored in the memory elements of the first group 108 based on sensing information and decoded data of neighboring storage elements of the second group 110.

The soft bit generator 116 may be implemented using a microprocessor or microcontroller programmed to receive sensing information of storage elements in the second group 110 and to generate information about physical characteristics of the storage elements of the second group 110. In a particular embodiment, the soft bit generator of FIG. 2 is implemented by the processor 240 executing the executable instructions 246 that are stored at the memory 242. Alternatively, or in addition, executable instructions that are executed by the processor 240 as the soft bit generator may be stored at a separate memory location that is not part of the memory 242, such as at a read-only memory (ROM) (not shown).

In a particular embodiment, the data storage device 102 may be a portable device configured to be selectively coupled to one or more external devices. However, in other embodiments, the data storage device 102 may be attached or embedded within one or more host devices, such as within a housing of a portable communication device. For example, the data storage device 102 may be within a packaged apparatus such as a wireless telephone, a personal digital assistant (PDA), gaming device or console, a portable navigation device, or other device that uses internal non-volatile memory. In a particular embodiment, the data storage device 102 includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of decoding data stored in a data storage device, the data storage device including a non-volatile memory having a three-dimensional (3D) memory configuration that includes memory cells and circuitry associated with operating the memory cells, the memory cells including a target group of memory cells, wherein each memory cell of the target group of memory cells stores one or more data bits by having a physical characteristic of the memory cell set to a corresponding range of values, and wherein the data bits stored in the cells of the target group of memory cells affect physical characteristics of a second group of memory cells, the method comprising:
    sensing the memory cells in the second group and generating information about the physical characteristics of the memory cells of the second group;
    decoding data bits stored in the memory cells of the second group;
    sensing the memory cells in the target group and generating information about the physical characteristics of the memory cells of the target group; and
    decoding data bits stored in the memory cells of the target group according to the information about the physical characteristics of the memory cells of the second group, according to the decoded data bits of the second group, and according to the information about the physical characteristics of the memory cells of the target group.

2. The method of claim 1, wherein the memory is a flash memory, and the physical characteristic is a threshold voltage.

3. The method of claim 1, wherein the target group of memory cells is a target word line, and wherein the second group of memory cells is a second word line.

4. The method of claim 1, wherein the target group of memory cells and the second group of memory cells are physically adjacent to each other.

5. The method of claim 1, wherein data is written to the target group of memory cells after second data is written to the second group of memory cells.

6. The method of claim 1, wherein the information about the physical characteristics of the memory cells of the second group affects the decoding of data bits stored in the memory cells of the target group by affecting initial reliability measures assigned to the data bits stored in the memory cells of the target group.

7. The method of claim 1, wherein the sensing of the memory cells in the second group is performed with a higher resolution than a resolution corresponding to a number of bits stored in each memory cell of the second group.

8. The method of claim 1, wherein the sensing of the memory cells in the target group is performed with a higher resolution than a resolution corresponding to a number of bits stored in each memory cell of the target group.

9. The method of claim 1, wherein the sensing of the memory cells in the target group is performed with a resolution corresponding to a number of bits stored in each memory cell of the target group.

10. The method of claim 1, wherein the sensing of the memory cells in the target group is performed with a lower resolution than a resolution corresponding to a number of bits stored in each memory cell of the target group.

11. The method of claim 1, wherein each memory cell of the target group stores a single bit.

12. The method of claim 1, wherein each memory cell of the target group stores multiple bits.

13. A method of decoding data stored in a data storage device, the data storage device including a non-volatile memory having a three-dimensional (3D) memory configuration that includes memory cells and circuitry associated with operating the memory cells, the memory cells including a target group of memory cells, wherein each memory cell of the target group of memory cells stores one or more data bits by having a physical characteristic of the memory cell set to a corresponding range of values, and wherein the data bits stored in the cells of the target group of memory cells affect physical characteristics of a second group of memory cells, the method comprising:
    sensing the memory cells in the second group and generating information about the physical characteristics of the memory cells of the second group;
    decoding data bits stored in the memory cells of the second group; and
    decoding data bits stored in the memory cells of the target group according to the information about the physical characteristics of the memory cells of the second group, according to the decoded data bits of the second group, and without information about the physical characteristics of the memory cells of the target group.

14. The method of claim 13, wherein the memory is a flash memory, and the physical characteristic is a threshold voltage.

15. The method of claim 13, wherein the target group of memory cells is a target word line, and wherein the second group of memory cells is a second word line.

16. The method of claim 13, wherein the target group of memory cells and the second group of memory cells are physically adjacent to each other.

17. The method of claim 13, wherein data is written to the target group of memory cells after second data is written to the second group of memory cells.

18. The method of claim 13, wherein the sensing of the memory cells in the second group is performed with a higher resolution than a resolution corresponding to a number of bits stored in each memory cell of the second group.

19. The method of claim 13, wherein each memory cell of the target group stores a single bit.

20. The method of claim 13, wherein each memory cell of the target group stores multiple bits.

21. A data storage device comprising:
a non-volatile having a three-dimensional (3D) memory configuration that includes memory cells, the memory cells including a first group of memory cells and a second group of memory cells, wherein each memory cell of the first group of memory cells stores one or more data bits by having a physical characteristic of the memory cell set to a corresponding range of values, and wherein the data bits stored in the cells of the first group of memory cells affect physical characteristics of the second group of memory cells; and
a controller coupled to the non-volatile memory, wherein the controller is configured to:
sense the memory cells in the second group and generate information about the physical characteristics of the memory cells of the second group;
decode data bits stored in the memory cells of the second group;
sense the memory cells in the first group and generate information about the physical characteristics of the memory cells of the first group; and
decode data bits stored in the memory cells of the first group according to the information about the physical characteristics of the memory cells of the second group, according to the decoded data bits of the second group, and according to the information about the physical characteristics of the memory cells of the first group.

22. The data storage device of claim 21, wherein the information about the physical characteristics of the memory cells of the second group affects the decoding of data bits stored in the memory cells of the first group by affecting initial reliability measures assigned to the data bits stored in the memory cells of the first group.

23. The data storage device of claim 21, wherein the first group of memory cells is a target word line, and wherein the second group of memory cells is a second word line.

24. A method of decoding data, the method comprising:
at a data storage device including a non-volatile memory having three dimensional (3D) memory configuration that includes memory cells and circuitry associated with operating the memory cells, the memory cells including a first group of storage elements and a second group of storage elements, performing:
decoding data bits stored in the first group of storage elements based on second sensing information corresponding to the second group of storage elements and further based on decoded data corresponding to second data stored by the second group of storage elements.

25. The method of claim 24, wherein decoding the data bits is further based on first sensing information corresponding to the first group of storage elements.

26. The method of claim 24, wherein decoding the data bits stored in the first group of storage elements is performed without sensing the first group of storage elements.

27. The method of claim 24, wherein decoding the data bits is performed by:
determining an offset for each storage element of the second group, the offset corresponding to a difference between a sensed value for the storage element and a decoded value for the storage element;
adjusting a soft bit value for each storage element of the first group according to the offset values of one or more of the storage elements of the second group; and
providing the adjusted soft bit values to a decoder, wherein the decoder generates the decoded data bits.

28. A method of decoding data stored in a data storage device, the data storage device including a non-volatile memory having a three-dimensional (3D) memory configuration that includes memory cells and circuitry associated with operating the memory cells, the memory cells including a first group of memory cells and in a second group of memory cells, wherein each memory cell of each group of memory cells stores one or more data bits by having a physical characteristic of the memory cell set to a corresponding range of values, and wherein the data bits stored in the memory cells of the first group of memory cells affect physical characteristics of the second group of memory cells and the data bits stored in the memory cells of the second group of memory cells affect physical characteristics of the first group of memory cells, the method comprising:
sensing the memory cells in the first group of memory cells and in the second group of memory cells and generating information about the physical characteristics of the memory cells of the first group and information about the physical characteristics of the memory cells of the second group;
generating a first estimation of data in the first group and a first estimation of data in the second group, wherein the first estimation of data in the first group includes first hard bits that correspond to the physical characteristics of the memory cells in the first group and first soft bits that provide an initial reliability measure of the first hard bits based on offset data of the second group, and wherein the first estimation of the second group includes second hard bits that correspond to the physical characteristics of the memory cells in the second group and second soft bits that provide an initial reliability measure of the second hard bits based on offset data of the first group; and
decoding data bits stored in the memory cells of the first group and stored in the memory cells of the second group according to the first estimation of the data in the first group and the first estimation of the data in the second group, and according to the information about the physical characteristics of the memory cells of the first group and the information about the physical characteristics of the memory cells of the second group.

29. The method of claim 28, further comprising:
determining an offset value for each memory cell of the first group, the offset value corresponding to a difference between a sensed value for the memory cell of the first group and an estimated data value for the memory cell of the first group; and
determining an offset value for each memory cell of the second group, the offset value corresponding to a difference between a sensed value for the memory cell of the second group and an estimated data value for the memory cell of the second group.

30. The method of claim 29, further comprising:
adjusting a soft bit value for each memory cell of the first group according to the offset values of one or more of the memory cells of the second group;
adjusting a soft bit value for each memory cell of the second group according to the offset values of one or more of the memory cells of the first group; and providing the adjusted soft bit values to a decoder, wherein the decoder decodes the data bits.

* * * * *